(12) United States Patent
Araki

(10) Patent No.: US 7,291,515 B2
(45) Date of Patent: Nov. 6, 2007

(54) FUNCTIONAL DEVICE AND METHOD FOR PRODUCING THE SAME

(75) Inventor: Yasushi Araki, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 251 days.

(21) Appl. No.: 11/180,639

(22) Filed: Jul. 14, 2005

(65) Prior Publication Data

US 2006/0110840 A1 May 25, 2006

(30) Foreign Application Priority Data

Jul. 16, 2004 (JP) .......................... P.2004-209903

(51) Int. Cl.
*H01L 51/00* (2006.01)

(52) U.S. Cl. .......................... 438/99; 257/40

(58) Field of Classification Search .................. 438/22, 438/48, 99
See application file for complete search history.

(56) References Cited

U.S. PATENT DOCUMENTS

2003/0206145 A1 * 11/2003 Spoonhower et al. ......... 345/84

2005/0238816 A1 * 10/2005 Hou et al. .................. 427/569

OTHER PUBLICATIONS

Tokito et al., High-temperature operation of an electroluminescent device fabricated using a novel triphenylamine derivative, Appl. Phys. Lett. 69, pp. 878-880, 1996.*

* cited by examiner

*Primary Examiner*—Bill Baumeister
*Assistant Examiner*—Minchul Yang
(74) *Attorney, Agent, or Firm*—Sughrue Mion, PLLC

(57) ABSTRACT

A method of producing a functional device which comprises forming a functional layer containing an organic material, an electrode layer and an insulating layer on a substrate, wherein the step of forming the insulating layer is effected with a temperature T of the substrate being controlled to satisfy the following relationship:

$$T \leq Tg \times (\Delta E2/\Delta E1)$$

where $Tg$ is a glass transition temperature of the organic material, $\Delta E1$ is an activation energy for crystallization of the organic material measured while the electrode layer and the insulating layer are not stacked on the functional layer and $\Delta E2$ is an activation energy for crystallization of the organic material while the electrode layer is formed on the functional layer.

10 Claims, 2 Drawing Sheets

FUNCTIONAL DEVICE AND METHOD FOR PRODUCING THE SAME

BACKGROUND OF THE INVENTION

This application is based on Japanese patent application JP 2004-209903, filed on Jul. 16, 2004, the entire content of which is hereby incorporated by reference, the same as if set forth at length.

FIELD OF THE INVENTION

The present invention relates a functional device and a method of producing same and more particularly to a functional device containing an organic material such as photoelectric conversion type solid-state image pickup device formed by stacking a photoelectric conversion layer containing an organic material on a substrate having a signal reading circuit formed thereon.

DESCRIPTION OF THE RELATED ART

A prototype device of a photoelectric conversion layer stacked type solid-state image pickup device is, for example, one described in JP-A-58-103165. This solid-state image pickup device is constructed such that three layers of photosensitive layers are stacked on a semiconductor substrate; and respective red (R), green (G) and blue (B) electric signals as detected in the respective photosensitive layers are read out by a MOS circuit formed on the surface of the semiconductor substrate.

Though the solid-state image pickup device having such a construction was proposed in the past, a CCD type image sensor and a CMOS type image sensor in which a number of light receiving parts (photodiodes) are integrated in a surface portion of a semiconductor substrate and respective red (R), green (G) and blue (B) color filters are stacked on the respective light receiving parts have extremely progressed. At present, an image sensor having several millions light receiving parts (pixels) integrated on one chip has been mounted in a digital still camera.

However, with respect to the CCD type image sensor or CMOS type image sensor, the technical progress reaches the vicinity to limits, and the size of the light receiving region (opening) of one light receiving part is about 2 μm and becomes closed to the order of a wavelength of incident light, resulting in facing a problem that the production yield is poor.

Further, an upper limit of the quantity of photoelectric charges to be accumulated one miniaturized light receiving part is low as about 3,000 in terms of the number of electrons, so that it becomes difficult to express 256 gradations beautifully. For this reason, it is difficult to expect to realize more properties in the image quality and sensitivity by the related art CCD type or CMOS type image sensors.

Then, as a solid-state image pickup device for solving these problems, the structure of the solid-state image pickup device as proposed in JP-A-58-103165 is given a second look, and image sensors as described in Japanese Patent No. 3,405,099 and JP-A-2002-83946 are newly proposed.

The image sensor as described in Japanese Patent No. 3,405,099 is constructed such that an ultra-fine particle of silicon is dispersed in a medium to form a photoelectric conversion layer; three layers of plural photoelectric conversion layers having a varied particle size of the ultra-fine particle are stacked on a semiconductor substrate; and electric signals are generated in the respective photoelectric conversion layers corresponding to the respective light receiving quantities of red, green and blue colors.

The image sensor as described in JP-A-2002-83946 is also the same and is constructed such that three layers of nano-silicon layers having a different particle size are stacked on a semiconductor substrate; and respective red, green and blue electric signals as detected in the respective nano-silicon layers are read out by accumulation diodes as formed in the surface portion of the semiconductor substrate.

Moreover, in the case where photoelectric conversion layers having such a construction are stacked on a semiconductor substrate, it is necessary that the respective photoelectric conversion layers sandwiched by an electrode layer are insulated from each other by an interlayer insulating layer and that the uppermost layer is covered by an insulating layer for passivation. As a method for forming an insulating layer having good moisture resistance and heat resistance, layer formation methods as described in JP-A-2000-269207 and JP-A-2000-277515 are proposed. However, it is considered whether or not such a related art layer formation method of an interlayer insulating layer can be applied to a photoelectric conversion layer stacked type solid-state image pickup device relies upon constituent materials of the photoelectric conversion layer.

For the sake of putting a photoelectric conversion layer stacked type solid-state image pickup device into practical use, it is necessary to solve a problem on what materials are to be used for forming a photoelectric conversion layer. In the related art technologies as described in Japanese Patent No. 3,405,099 and JP-A-2002-83946, the photoelectric conversion layer is made of an ultra-fine particle of silicon or constructed of a nano-silicon layer. However, more actually, it may be said to be preferable that the photoelectric conversion layer is made of an organic material such as organic semiconductors.

However, if a photoelectric conversion layer containing an organic material is stacked on a semiconductor substrate and further, the layer formation method of an interlayer insulating layer as described in JP-A-2000-269207 or JP-A-2000-277515 is applied, thereby layer forming an insulating layer, the layer formation temperature of the insulating layer is too high so that the photoelectric conversion characteristics of the photoelectric conversion layer are deteriorated, whereby a good image data cannot be obtained. For this reason, in the case of constructing the photoelectric conversion layer using an organic material, it is necessary to determine a layer formation condition of the insulating layer.

SUMMARY OF THE INVENTION

An aim of the invention is to form an insulating layer without causing the deterioration of the functional layer containing an organic material and hence a functional device having a high reliability.

Another aim of the invention is to provide a photoelectric conversion layer stacked type solid-state image pickup device comprising a stack of a photoelectric conversion layer containing an organic material, an electrode layer and an insulating layer without causing the deterioration of the photoelectric conversion characteristics of the photoelectric conversion layer and a method for the production thereof.

The invention concerns a method of producing a functional device which comprises forming a functional layer containing an organic material, an electrode layer and an insulating layer on a substrate, wherein the step of forming the insulating layer is effected with a temperature T of the substrate being controlled to satisfy the following relationship:

$$T \leq Tg \times (\Delta E2/\Delta E1)$$

where Tg is a glass transition temperature of the organic material, ΔE1 is an activation energy for crystallization of the organic material measured while the electrode layer and the insulating layer are not stacked on the functional layer and ΔE2 is an activation energy for crystallization of the organic material while the electrode layer is formed on the functional layer.

It is known that one of the causes of deterioration of photoelectric conversion characteristics is the crystallization of organic amorphous thin layer. The formation of the upper layer is normally effected at a temperature of not higher than the crystallization temperature thereof. However, the results of various experiments show that the crystallization temperature of the upper layer varies with the material constituting the opposing electrode stacked in the upper portion. It is also made obvious that the forming temperature of the insulating layer to be stacked on the opposing electrode layer (substrate temperature) needs to be controlled according to the change of the crystallization temperature thereof. In some detail, as the crystallization temperature lowers, the insulating layer needs to be formed at lower temperature. On the contrary, as the crystallization temperature rises, the forming temperature can be raised more to form an insulating layer having better properties. In other words, when the properties of the insulating layer are optimized so far as the photoelectric conversion characteristics of the photoelectric conversion layer cannot be impaired, the insulating layer can be formed at a temperature close to the highest allowable value without causing the crystallization of the organic material, making it possible to form a functional device having a high reliability.

In the invention, in the method for the production of the aforementioned functional device, the step of stacking the insulating layer is effected with the temperature T of the aforementioned substrate being controlled to 200° C. or less.

By controlling the substrate temperature to 200° C. or less, the insulating layer can be formed without causing the deterioration thereof. When the substrate temperature exceeds 200° C., the interfacial reaction of the organic material with the electrode layer or insulating layer in contact therewith can easily occur, making it easy to cause deterioration.

In the invention, the aforementioned electrode layer may comprise a light-transmitting material in the method for the production of a functional device.

In the invention, the aforementioned electrode layer comprises at least one of ITO, IZO, SnO$_2$, ATO, ZnO and FTO in the method for the production of a functional device.

In the case where the electrode layer is formed by a light-transmitting material such as ITO, IZO, SnO$_2$, ATO, ZnO, TiO$_2$ and FTO, the interfacial reaction can easily occur between the electrode layer and the functional layer made of an organic material at the step of forming the insulating layer, causing deterioration in particular. However, by predetermining the forming temperature of the insulating layer such that the aforementioned requirements can be satisfied, the desired characteristics of the element can be fairly maintained.

In the invention, the aforementioned insulating layer may comprise silicon oxide or silicon nitride in the method for the production of a functional device.

Since the characteristics of the silicon oxide layer or silicon nitride layer depend greatly on the forming temperature of the layer, the desired characteristics of the element can be fairly maintained by predetermining the forming temperature of the insulating layer such that the aforementioned requirements can be satisfied.

In the invention, the aforementioned insulating layer may be formed by plasma CVD in the method for the production of a functional device.

The rise of the forming temperature in plasma CVD as high as possible can make a great contribution to enhancement of characteristics.

In the invention, the aforementioned insulating layer may be formed by sputtering in the method for the production of a functional device.

By raising the substrate temperature in sputtering while satisfying the aforementioned requirements, the sputtering atoms can move fairly on the substrate to form a dense insulating layer having a high reliability.

In the invention, the aforementioned functional device may be a photoelectric conversion layer stacked type solid-state image pickup device and there may be provided a step of stacking a photoelectric conversion layer containing an organic material on a substrate having a signal reading circuit formed thereon and stacking an electrode layer and an insulating layer on the photoelectric conversion layer.

At the step of forming a functional device involving staking step, the forming temperature of the insulating layer as an upper layer makes a great contribution to the characteristics of the element.

In the invention, the aforementioned functional device may be an organic light-emitting element in the method for the production of a functional device.

In the invention, the water permeability of the insulating layer may be not more than 0.01 g/m$^2$·day in the method for the production of a functional device.

In the invention, the dielectric breakdown electric field strength of the insulating layer may be 1 MV/cm or more.

In the invention, the supplied electric power at the time of layer forming the insulating layer by plasma CVD may be from not lower than 5 W to not higher than 500 W.

In the invention, the supplied electric power at the time of layer forming the insulating layer by sputtering may be from not lower than 10 W to not higher than 4,000 W.

In the invention, the chamber internal pressure at the time of layer forming the insulating layer by sputtering may be from not lower than 0.01 Pa to not higher than 50 Pa.

The invention further concerns a functional device thus produced.

In accordance with the invention, an insulating layer can be formed at a low temperature under proper conditions according to the constituent materials, making it possible to provide a functional device such as photoelectric conversion layer stacked type solid-state image pickup device having good photoelectric conversion characteristics.

Further, an insulating layer can be formed at a temperature close to the highest allowable value according to the constituent materials, making it possible to form a functional device having good characteristics.

DETAILED DESCRITPION OF THE INVENTION

One embodiment of the invention will be described below with reference to the accompanying drawing.

Figure 1:
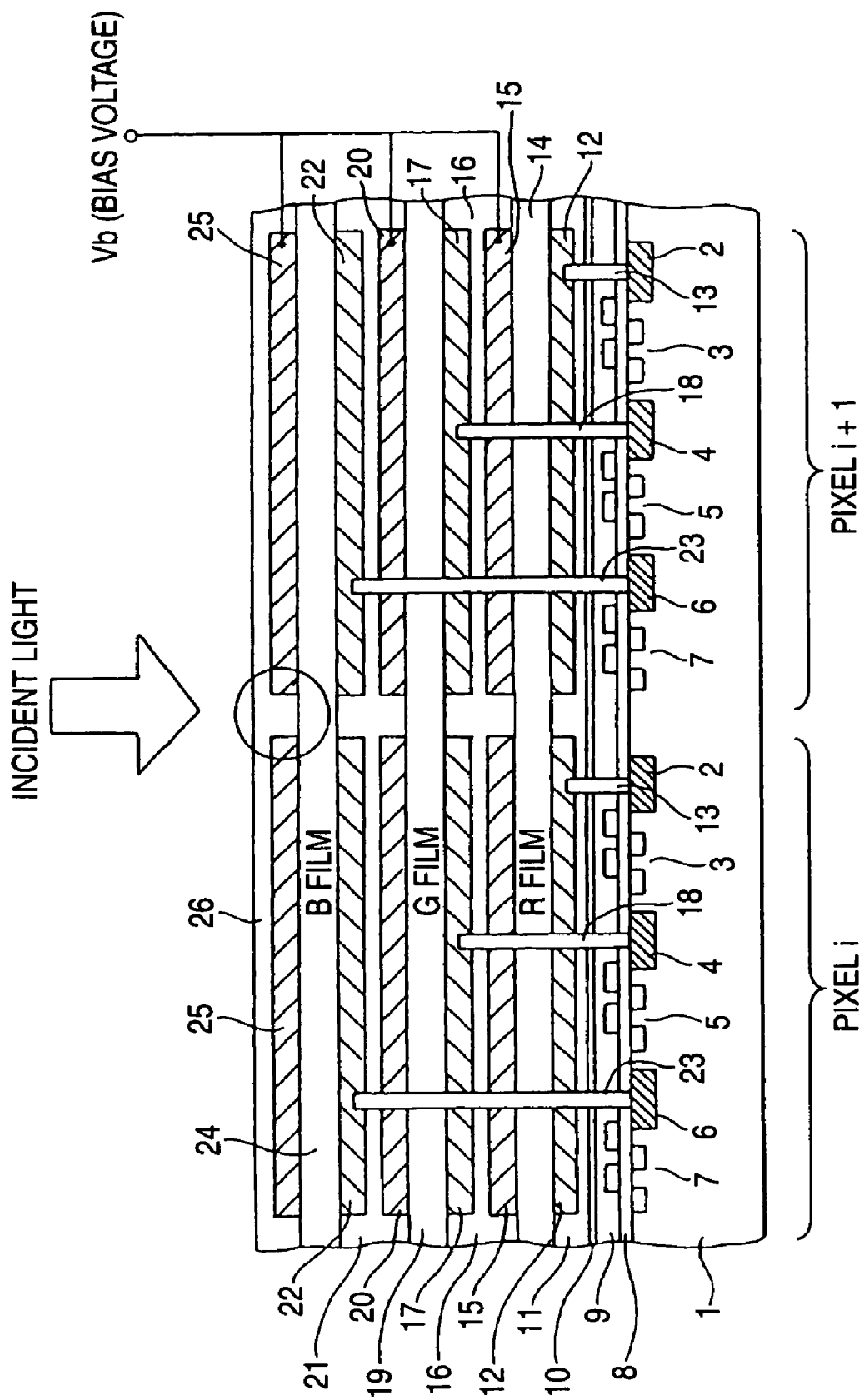
FIG. 1 is a diagrammatic sectional view of a two pixel portion of a three-layer photoelectric conversion layer type solid-state image pickup device according to an embodiment of implementation of the invention.

FIG. 1 is a cross-sectional schematic view of a part of two pixels of a photoelectric conversion layer stacked type solid-state image pickup device according to one embodiment of the invention. This embodiment has a construction in which three layers of photoelectric conversion layers are stacked, and red (R), green (G) and blue (B) electric signals corresponding to the three primary colors are taken out, namely, a construction in which a color image is imaged. However, a construction in which only one layer of a photoelectric conversion layer is stacked, thereby imaging a monochromic image, for example, a black-and-white image may be employed.

Further, a construction in which four or more layers of photoelectric conversion layers are stacked; besides the three primary colors of red, green and blue colors, for example, an intermediate color between blue and green colors (an emerald color corresponding to negative sensitivity among red luminosity factors of a human being) is detected; and a red detected signal is corrected by a detected signal of this intermediate color may be employed.

In FIG. 1, a red signal-accumulating high-concentration impurity region 2, a red signal-reading MOS circuit 3, a green signal-accumulating high-concentration impurity region 4, a green signal-reading MOS circuit 5, a blue signal-accumulating high-concentration region 6, and a blue signal-reading MOS circuit 7 are formed in a surface portion of a P well layer 1 formed on a substrate, for example, an n-type silicon substrate.

The respective MOS circuits 3, 5 and 7 are each comprised of an impurity region for source and drain formed on the surface of a semiconductor substrate and a gate electrode as formed via a gate insulating layer 8. An insulating layer 9 is deposited in the upper portion of the gate insulating layer 8 and the gate electrode and then flattened. A light-shielding layer 10 is formed on the surface of this insulating layer 9. In many cases, the light-shielding layer 10 is formed of a metallic thin layer, and therefore, an insulating layer 11 is further deposited thereon. In the case where the light-shielding layer 10 is not provided in this place, the insulating layers 9 and 11 as illustrated in the drawing may be integrated.

Signal charges of respective colors (red, green and blue colors) as generated in respective photoelectric conversion layers 14, 19 and 24 as described later are accumulated in the foregoing color signal-accumulating high-concentration impurity regions 2, 4 and 6, respectively; and signals each corresponding to the quantity of the signal charge are read out by the MOS circuits 3, 5 and 7, respectively and taken out externally by reading electrodes to be formed on the semiconductor substrate. The construction is the same as in the related art CMOS type image sensor (not illustrated).

Also, though this example is constructed such that signals each corresponding to the quantity of the signal charge are read out by the MOS circuits as formed on the semiconductor substrate, a construction in which the accumulated charges in the color signal-accumulating high-concentration impurity regions 2, 4 and 6 are moved along a vertical transfer path likewise the related art CCD type image sensor and read out externally along a horizontal transfer path may be employed.

The aforementioned constitution is produced by the semiconductor process for related art CCD type image sensor or CMOS type image sensor. By additionally subjecting the upper layer to the following steps, a photoelectric conversion layer stacked type solid-state image pickup device is produced.

A light-transmitting electrode layer 12 is formed on an insulating layer 11 shown in FIG. 1. The light-transmitting electrode layer 12 is formed by sputtering ITO (indium tin oxide) or the like to form a layer, and then subjecting the layer to patterning process (etching) involving photolithography so that it is separated every pixel. The light-transmitting electrode layer for each pixel (red pixel electrode layer) 12 is connected to a red signal-accumulating high concentration impurity region 2 via a contact plug (longitudinal wiring) 13. The contact plug 13 is electrically insulated from the regions other than the red pixel electrode layer 12 and the high concentration impurity region 2.

Subsequently, a red color-detecting photoelectric conversion layer 14 for example is formed on the red pixel electrode layer 12. A light-transmitting electrode layer 15 (opposing electrode layer disposed opposed to the pixel electrode layer 12: The layer constitutes a common electrode layer for applying a common potential to the pixel electrode layers 12) is then formed on the red color-detecting photoelectric conversion layer 14. In other words, the red color-detecting photoelectric conversion layer 14 is disposed interposed between a pair of light-transmitting electrode layers 12, 15. The electrode layer 12, which is a lowermost layer, may be formed by a light-shielding material to act as a light-shielding layer as well.

On the common electrode layer 15 is formed a light-transmitting insulating layer (interlayer insulating layer) 16 mainly composed of silicon oxide or silicon nitride on which a light-transmitting electrode layer 17 is formed. The light-transmitting electrode layer 17 is formed by sputtering a light-transmitting electrode material such as ITO to form a layer, and then subjecting the layer to patterning process (etching) involving photolithography in the same manner as mentioned above so that the layer is separated every pixel. The light-transmitting electrode layer for each pixel (green pixel electrode layer) 17 is connected to a green signal-accumulating high concentration impurity region 4 via a contact plug (longitudinal wiring) 18. The contact plug 18 is electrically insulated from the regions other than the green pixel electrode layer 17 and the high concentration impurity region 4.

On the green pixel electrode layer 17 is formed, e.g., a green color-detecting photoelectric conversion layer 19 on which a light-transmitting electrode layer (opposing electrode layer=common electrode layer) 20. In other words, the green color-detecting photoelectric conversion layer 19 is disposed interposed between a pair of light-transmitting electrode layers 17,20.

On the common electrode layer 20 is formed a light-transmitting insulating layer (interlayer insulating layer) 21 on which a light-transmitting electrode layer 22 is formed. The light-transmitting electrode layer 22 is formed by sputtering a light-transmitting electrode material such as ITO to form a layer, and then subjecting the layer to patterning process (etching) involving photolithography so that the layer is separated every pixel. The light-transmitting electrode layer for each pixel (blue pixel electrode layer) 22 is connected to a blue signal-accumulating high concentration impurity region 6 via a contact plug (longitudinal wiring) 23. The electrode 23 is electrically insulated from the regions other than the blue pixel electrode layer 22 and the high concentration impurity region 6.

A blue color-detecting photoelectric conversion layer 24 is formed in the upper portion of the blue pixel electrode layer 22, and a light-transmitting electrode layer (a counter electrode layer=a common electrode layer) 25 is further formed in the upper portion thereof. That is, this is constructed such that the blue color-detecting photoelectric conversion layer 24 is interposed by a pair of the light-transmitting electrode layers 22 and 25. Then, a light-transmitting insulating layer 26 for passivation is provided in the uppermost layer.

As the uniform light-transmitting electrode layers 12, 15, 17, 20, 22 and 25, thin layers made of tin oxide ($SnO_2$), titanium oxide ($TiO_2$), indium oxide ($InO_2$), or indium tin oxide (ITO) are useful, but it should not be construed that the invention is limited thereto. As the formation method, a laser abrasion method and a sputtering method are useful, but basically, any method is useful in the invention. Examples of the layer formation method include layer formation methods by a resistance heating vacuum vapor deposition device, an electron beam vapor deposition device, an RF magnetron sputtering device, a DC magnetron sputtering device, a counter target sputtering device, CVD, MBE, or PLD. Of these, layer formation methods by an electron beam vapor deposition device, an RF magnetron sputtering device, a DC magnetron sputtering device, or a counter target sputtering device are especially preferable.

As the light-transmitting insulating layers 16, 21 and 26, thin layers made of silicon oxide or silicon nitride are useful, but it should not be construed that the invention is limited thereto. As the formation method, a CVD method, a plasma CVD method, a sputtering method, and the like are useful, but it should not be construed that the invention is limited thereto. Coating may be employed as the formation method.

Further, the photoelectric conversion layers 14, 19 and 24 are each constructed of an organic material such as organic semiconductors in this embodiment.

The organic semiconductor includes a hole transport material and an electron transport material. Examples of the hole transport material which can be used include poly-N-vinylcarbazole derivatives, polyphenylenevinylene derivatives, polyphenylenes, polythiophenes, polymethylphenylsilanes, polyanilines, triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, carbazole derivatives, styrylanthracene derivatives, fluorenone derivatives, hydrazone derivatives, stilbene derivatives, porphyrin derivatives (for example, phthalocyanine), aromatic tertiary amine compounds, styrylamine compounds, butadiene compounds, benzidine derivatives, polystyrene derivatives, triphenylmethane derivatives, tetraphenylbenzene derivatives, and starburst polyamine derivatives.

Also, examples of the electron transport organic material include oxadiazole derivatives, triazole derivatives, triazine derivatives, nitro-substituted fluorenone derivatives, thiopyran dioxide derivatives, diphenylquinone derivatives, perylenetetracarboxyl derivatives, anthraxquinonedimethane derivatives, fluorenylidenemethane derivatives, anthrone derivatives, perynone derivatives, oxine derivatives, and quinoline complex derivatives.

Examples of organic dyes which can be suitably used include metal complex dyes, cyanine based dyes, merocyanine based dyes, phenylxanthene based dyes, triphenylmethane based dyes, rhodacyanine based dyes, xanthene based dyes, large cyclic azaannulene based dyes, azulene based dyes, naphthoquinone based dyes, anthraquinone based dyes, chain compounds resulting from condensation of a fused polycyclic aromatic compound and an aromatic or heterocyclic compound such as anthracene and pyrene, two nitrogen-containing heterocyclic compounds having a squalium group and a croconic methine group as binding chains such as quinoline, benzothiazole, and benzoxazole, and cyanine based analogous dyes bound by a squalium group and a croconic methine group.

In the case where the organic dye is a metal complex dye, dithiol metal complex based dyes, metallic phthalocyanine dyes, metallic porphyrin dyes, and ruthenium complex dyes are preferable; and ruthenium complex dyes are especially preferable.

Examples of the ruthenium complex dye include complex dyes described in U.S. Pat. Nos. 4,927,721, 4,684,537, 5,084,365, 5,350,644, 5,463,057 and 5,525,440, JP-A-7-249790, JP-T-10-504512, WO 98/50393, and JP-A-2000-26487. Further, specific examples of polymethine dyes such as cyanine dyes, merocyanine dyes, and squalium dyes include dyes described in JP-A-11-35836, JP-A-11-67285, JP-A-11-86916, JP-A-11-97725, JP-A-11-158395, JP-A-11-163378, JP-A-11-214730, JP-A-11-214731, JP-A-11-238905, JP-A-2000-26487, and European Patent Nos. 892,411, 911,841 and 991,092.

FIG. 1 is a cross-sectional schematic view but does not correctly reflect an actual thickness ratio. Actually, it is necessary to carry out the layer formation under such a condition that the thickness of each of the light-transmitting insulating layers 16, 21 and 26 is made thicker than that of each of the light-transmitting electrode layers 12, 15, 17, 20, 22 and 25, whereby the photoelectric conversion characteristics of the organic material-containing photoelectric conversion layers 14, 19 and 24 are not deteriorated during the layer formation of the respective light-transmitting insulating layers 16, 21 and 26.

Then, in this embodiment, in the case of stacking the photoelectric conversion layer containing an organic material such as organic semiconductors, the light-transmitting electrode layer, and the light-transmitting insulating layer in sequence, the light-transmitting insulating is subjected to layer formation at a temperature which is satisfied with the relationship represented by the following expression.

$$\text{(Substrate temperature } T) \leq Tg \times (\Delta E_2 / \Delta E_1) \qquad \text{Expression 1}$$

In the foregoing expression, (i) Tg represents a glass transition temperature of the organic material;

(ii) $\Delta E_1$ represents activation energy for crystallization of the organic material as measured in the state that the counter electrode layer and the insulating layer are not stacked on the organic material layer (photoelectric conversion layer); and (iii) $\Delta E_2$ represents activation energy of the organic material as measured in the state that at lease one counter electrode layer is stacked on the organic material layer.

The "substrate temperature T" as referred to herein means a temperature of the substrate at the time of layer formation. For example, the "substrate" at the time of layer formation of the light-transmitting insulating layer 21 in FIG. 1 is the semiconductor substrate 1 having up to the light-transmitting electrode layer 20 stacked thereon; and the "substrate" at the time of layer formation of the light-transmitting insulating layer 16 is the semiconductor substrate 1 having up to the light-transmitting electrode layer 25 stacked thereon.

Though an upper limit of this substrate temperature T varies depending upon the constituent materials of the photoelectric conversion layers as already stacked on the foregoing "substrate" and the constituent materials of the electrode layers to be brought into contact therewith, if the layer formation is carried out at a temperature of not higher than 200° C., such is acceptable. However, since the foregoing expression 1 does not define a lower limit of the substrate temperature, it is preferable that the layer formation is carried out at a lower temperature, for example, not higher than 150° C., more preferably not higher than 100° C., and especially preferably not higher than 80° C.

One of the reasons of deterioration of the photoelectric conversion characteristics resides in crystallization of an amorphous organic thin layer, and the layer formation of the layer as an upper layer thereof is usually carried out at a temperature of not higher than the subject crystallization temperature. However, according to studies made by the present inventor, it has been noted that the subject crystallization temperature varies depending upon the material of the counter electrode layer to be stacked thereon. It is necessary that the layer formation temperature (substrate temperature) of the insulating layer to be stacked on the counter electrode layer is controlled adaptive with the change of the subject crystallization temperature.

When the crystallization temperature is a low temperature, it is necessary that the insulating layer is formed by layer formation at a lower temperature. On the other hand, when the crystallization temperature is a high temperature, the layer formation can be made high while aiming an insulating layer with higher performance. That is, it is possible to optimize the performance of the insulating layer within the range where the photoelectric conversion characteristics of the photoelectric conversion layer are not hindered.

Physical interpretation of this phenomenon will be described below. Usually, a free energy change $\Delta G$ by the formation of a crystal nucleus having a radius r in the thin layer is expressed as follows.

$$\Delta G = 2\pi r d\gamma ac + 2\pi r^2 \Delta\gamma - \pi r^2 d\Delta Gv$$

In the foregoing expression, $\Delta Gv$ represents a reduction of free energy per unit volume due to the formation of a crystal nucleus;

$\Delta\gamma$ represents a difference of interfacial free energy between the crystal of the organic material and the surrounding from interfacial free energy between the amorphous organic material and the surrounding;

$\gamma ac$ represents interfacial free energy between the crystal phase of the organic material and the amorphous phase per unit area; and d represents a thickness.

The activation energy for crystallization can be easily determined as the maximum value thereof. This activation energy for crystallization is related to a difference of interfacial free energy between the organic material and the surrounding from interfacial free energy between the amorphous organic material and the surrounding, and when this difference is positive, the crystallization temperature tends to rise, whereas when this difference is negative, the crystallization temperature tends to drop. Then, it has been noted that this crystallization temperature is approximately expressed by $[Tg \times (\Delta E_2/\Delta E_1)]$. Thus, in this embodiment, the substrate temperature T is controlled so as to be satisfied with the expression 1 as described previously.

The glass transition temperature Tg is measured by TG-DTA (differential thermal analyzer); and the activation energy for crystallization can be determined by storing the thin layer while changing the temperature and Arrhenius plotting a time until a crystal has been observed.

As described previously, the layer formation of the light-transmitting insulating layer is carried out while controlling the substrate temperature at a temperature of not higher than the crystallization temperature of the organic material. When the light-transmitting insulating layer is subjected to layer formation at a low temperature, the layer formation is carried out such that its water permeability is not more than 0.01 g/m²·day, preferably from $1 \times 10^{-9}$ to $1 \times 10^{-2}$ g/m²·day, more preferably from $1 \times 10^{-9}$ to $1 \times 10^{-4}$ g/m²·day, and further preferably from $1 \times 10^{-9}$ to $1 \times 1^{-6}$ g/m²·day. In the case of ordinary semiconductor devices, cleaning with ultrapure water is often effected at various processes. Thus, it is by no means necessary that care be taken in the water permeability of the insulating layer under the wiring, excluding the passivated layer in the uppermost portion. However, the water permeability is one of extremely important characteristics in the invention. Even when an insulating layer is layer formed in the state that a pin hole is not contained at all, it is impossible to make the water permeability zero. However, needless to say, what the water permeability is small is preferable as the insulating layer. The water permeability can be measured by, for example, a water permeability analyzer manufactured by MOCON, U.S.A.

Further, besides the water permeability, the light-transmitting insulating layer must be layer formed such that its dielectric breakdown electric field strength is 1 MV/cm or more. This is because as a matter of course, the light-transmitting insulating layer must function as the interlayer insulating layer.

Incidentally, the light-transmitting insulating layers 16 and 21 as the internal layer may have a water permeability lower than that of the insulating layer 26 as the passivation layer. Conversely, the insulating layer 26 as the outermost layer may have a dielectric breakdown electric field strength lower than that of the light-transmitting insulating layers 16 and 21 as the interlayer insulating layer.

One example of the layer formation condition of the light-transmitting insulating layer in the sputtering method and the plasma CVD method will be shown below.

EXAMPLE 1

In an example of the invention, the following compounds 1 to 13 to be formed on an electrode layer to provide a photoelectric conversion layer were measured for glass transition temperature Tg by TG-DTA. Thereafter, ITO was deposited on the entire surface of a glass substrate (under the same conditions as used in the following method of depositing ITO). The aforementioned compounds were each then deposited on the glass substrate with ITO to a thickness as small as 50 nm by a resistive evaporation method to prepare 13 samples. These samples were each then determined for $\Delta E_1$ while being kept in a nitrogen atmosphere. Subsequently, ITO was deposited on each of the samples prepared under the same conditions as mentioned above (under the same deposition conditions as used in the following method of depositing ITO). These samples were each then determined for $\Delta E_2$ while being kept in a nitrogen atmosphere.

From these values was then determined Tg×(ΔE2/ΔE1) of the compounds 1 to 13. The results are set forth in Table 1 with glass transition temperature.
-continued
(Compound 1)
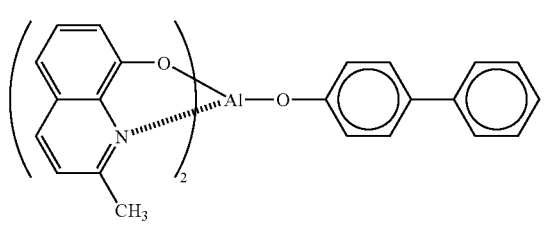
(Compound 2)
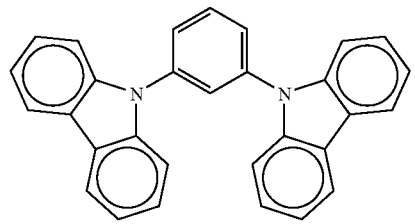
(Compound 3)
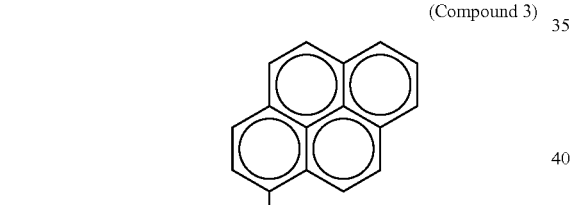
(Compound 4)
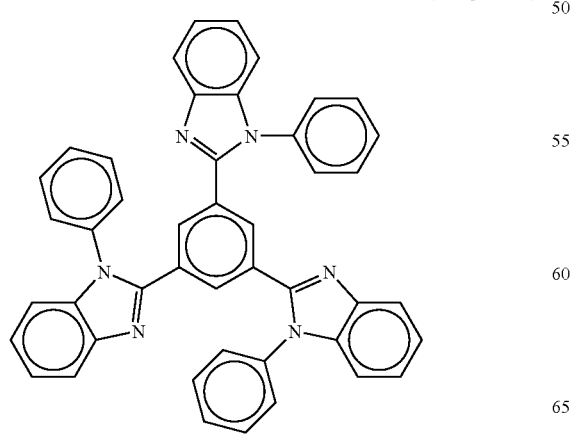
(Compound 5)
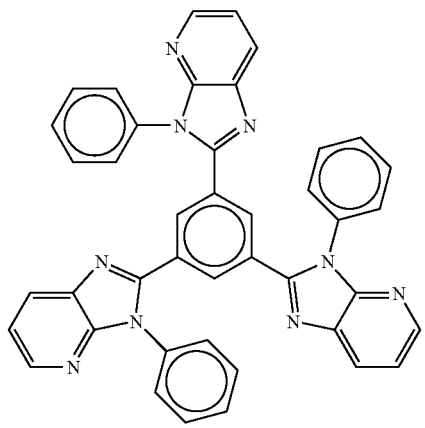
(Compound 6)
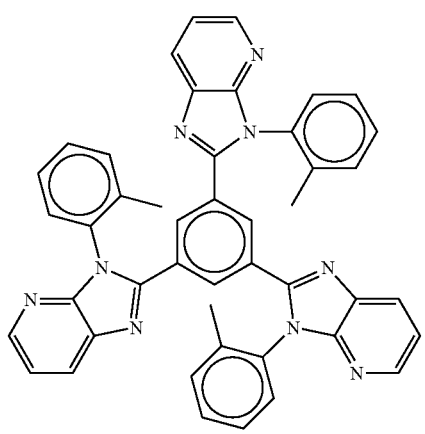
(Compound 7)
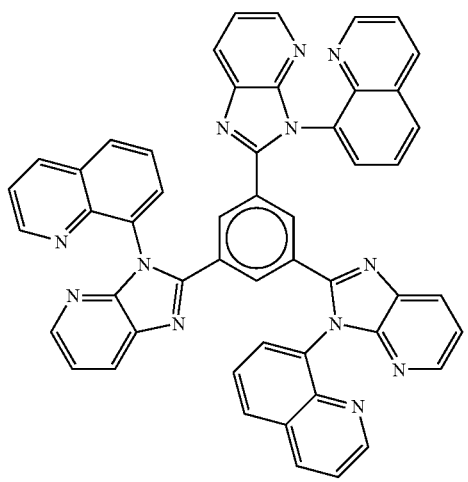

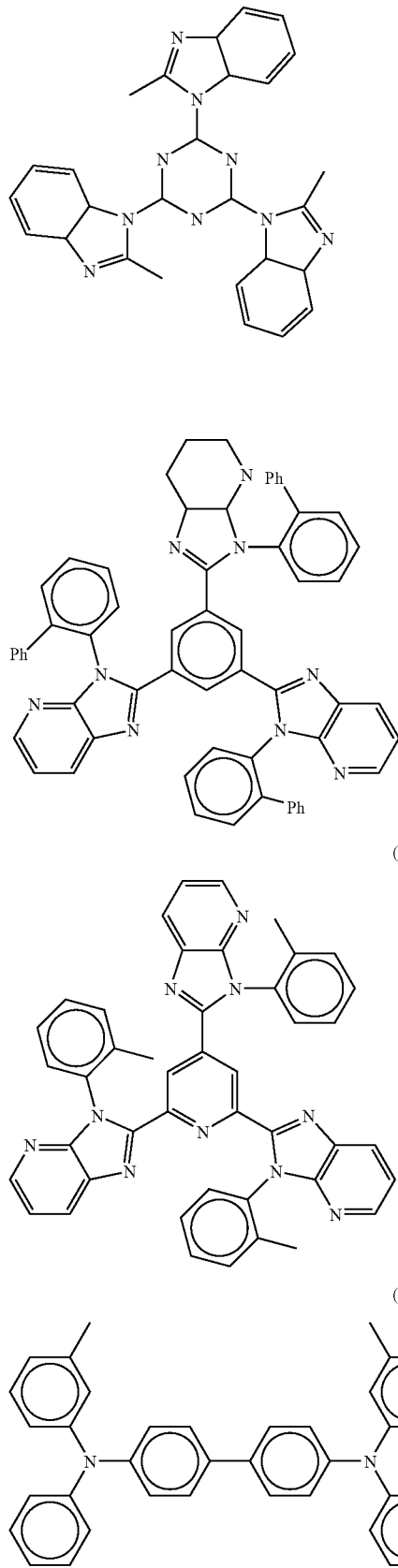

(Compound 8)

(Compound 9)

(Compound 10)

(Compound 11)

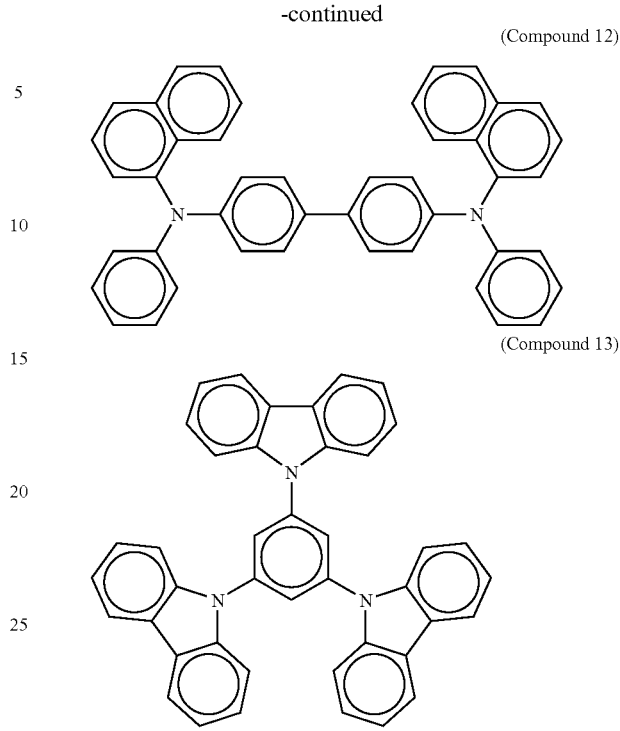

(Compound 12)

(Compound 13)

TABLE 1

| | Glass transition temperature Tg (° C.) | Tg × ΔE$_2$/ΔE$_1$ (° C.) |
|---|---|---|
| Compound 1 | 94 | 75 |
| Compound 2 | 62 | 66 |
| Compound 3 | 168 | 169 |
| Compound 4 | 123 | 95 |
| Compound 5 | 137 | 121 |
| Compound 6 | 136 | 129 |
| Compound 7 | 189 | 174 |
| Compound 8 | 96 | 90 |
| Compound 9 | 141 | 130 |
| Compound 10 | 129 | 120 |
| Compound 11 | 64 | 59 |
| Compound 12 | 115 | 118 |
| Compound 13 | 124 | 128 |

Figure 2:
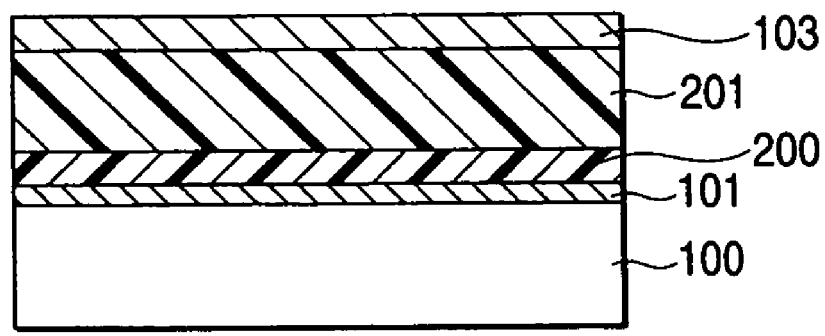
FIG. 2 is a diagrammatic sectional view illustrating a method of forming an insulating layer in Example 1 of the invention.
Figure 2:
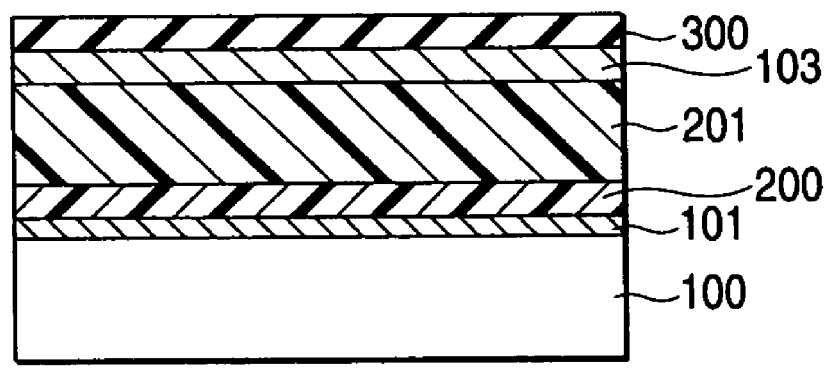

Subsequently, the compounds 4, 5, 6, 7, 9 and 10 were each subjected to the following test. In some detail, a 2.5 cm square glass substrate 100 of #1737 of Coning Corporation was ultrasonically cleaned with acetone, Semico Clean and isopropyl alcohol (IPA) each for 15 minutes. Finally, the glass substrate was boil-cleaned with IPA, and then subjected to UV/O$_3$ cleaning. The glass substrate was moved into a sputtering chamber where it was then fixed to a substrate holder together with a mask patterned such that two lines of electrode are formed at an interval of 5 mm. The pressure in the sputtering chamber was then reduced to $3 \times 10^{-5}$ Pa. ITO was then sputter-deposited as light-transmitting electrode layer 101 on the glass substrate 100 to a thickness of 0.2 μm. The ITO layer thus obtained exhibited a surface resistivity of 7 Ω/sq. The glass substrate was moved into an organic layer depositing chamber. The pressure in the organic layer depositing chamber was then reduced to $3 \times 10^{-4}$ Pa. Thereafter, the following compound 14 was vacuum-deposited as functional layer 200 on the glass substrate at a rate of from 0.3 to 0.4 nm/sec to a thickness of 40 nm while the substrate holder was being rotated. The compound 4 was then vacuum-deposited as functional layer 201 on the functional layer 200 to a thickness of 60 nm. ITO was then again deposited as light-transmitting electrode 103 on the functional layer 201 to a thickness of 0.20 μm (FIG. 2(a)).

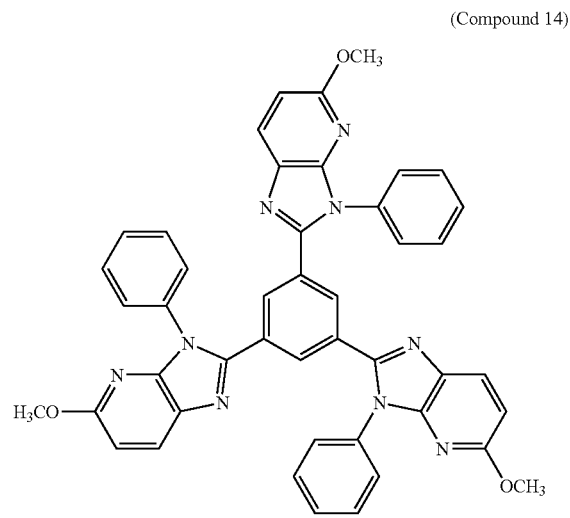

(Compound 14)

Subsequently, the aforementioned test procedure was followed except that the compound 4 was replaced by the compounds 5, 6, 7, 9 and 10. These elements were each then measured for dark current. Thereafter, the following two insulating layers 300 (sputtering/plasma CVD) were deposited on these elements (FIG. 2(b)). During the deposition of insulating layer, the substrate temperature was varied. The relative value of dark current after deposition with respect to that before deposition was measured. The results are set forth in Table 2 below.

TABLE 2

| Compound 4 | 0.98 | 8.9 | 11.0 | 12.0 |
| --- | --- | --- | --- | --- |
|  | (90° C.) | (100° C.) | (110° C.) | (125° C.) |
| Compound 5 | 1.1 | 11.5 | 13.2 | 14.0 |
|  | (115° C.) | (125° C.) | (135° C.) | (145° C.) |
| Compound 6 | 1.05 | 10.5 | 11.4 | 11.8 |
|  | (120° C.) | (130° C.) | (140° C.) | (150° C.) |
| Compound 7 | 1.1 | 11.9 | 12.1 | 13.5 |
|  | (170° C.) | (180° C.) | (190° C.) | (200° C.) |
| Compound 9 | 1.05 | 13.5 | 14.4 | 14.3 |
|  | (125° C.) | (135° C.) | (145° C.) | (155° C.) |
| Compound 10 | 1.08 | 11.1 | 12.4 | 12.8 |
|  | (115° C.) | (125° C.) | (135° C.) | (145° C.) |

(Sputtering Layer Formation Condition)
  Magnetron sputtering device
  Target: $SiO_2$
  RF sputtering
  Supplied electric power: 400 W
  Sputtering pressure: $8 \times 10^{-1}$ Pa
  To introduce oxygen at a molar ratio of 2%
(Plasma CVD Condition)
  $SiH_4$ flow rate: 100 sccm
  $N_2$ flow rate: 1,500 sccm
  RF supplied electric power: 300 W Pressure: To reduce the pressure at a rate of 5 Pa per minute from an initial pressure of 100 Pa As can be seen in Table 2, when the layer deposition is effected at a substrate temperature of more than $Tg \times (\Delta E_2/\Delta E_1)$ rather than the glass transition temperature Tg, the resulting element exhibits a dark current close to 10 times that at the glass transition temperature Tg.

EXAMPLE 2

An element was prepared in the same manner as in Example 1 except that the conditions under which the organic material is deposited on the substrate which has been moved into the organic layer depositing chamber were changed as follows. In some detail, the pressure in the chamber was reduced to $3 \times 10^{-4}$ Pa. The compound 12 was vacuum-deposited as functional layer 200 on the substrate at a rate of from 0.3 to 0.4 nm/sec to a thickness of 40 nm while the substrate holder was being rotated. A 10:1 mixture by weight of the compound 15 and the compound 16 was then deposited as functional layer 201 on the functional layer 200 to a thickness of 20 nm. The aforementioned test procedure was followed except that the compound 4 was replaced by the compounds 5, 6, 7, 9 and 10. These elements were each then measured for dark current. Thereafter, the following two insulating layers 300 (sputtering/plasma CVD) were deposited on these elements (FIG. 2(b)). During the deposition of insulating layer, the substrate temperature was varied. The relative value of dark current after deposition with respect to that before deposition was measured.

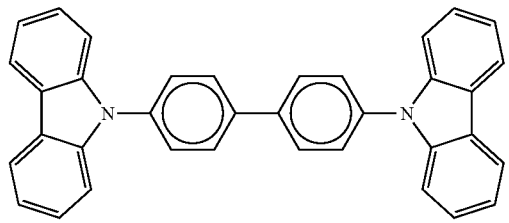

(Compound 15)

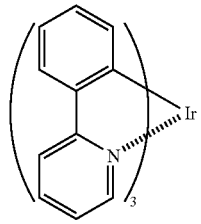

(Compound 16)

These elements were each then measured for light-emitting efficiency. During the deposition of the two insulating layers (sputtering/plasma CVD), the substrate temperature was varied. The light-emitting efficiency was relatively measured before and after deposition. Consequently, the results similar to those of the example were obtained.

The photoelectric conversion layer stacked type solid-state image pickup device according to the invention exhibits good photoelectric conversion characteristics and thus can be used in place of related art CCD type or CMOS type image sensors. The photoelectric conversion layer stacked type solid-state image pickup device according to the invention is also advantageous in that it can be provided with a greater picture area than ever and hence a raised sensitivity.

Accordingly, the photoelectric conversion layer stacked type solid-state image pickup device according to the invention can be incorporated in digital camera in particular.

What is claimed is:

1. A method of producing a functional device which comprises
forming a functional layer containing an organic material, an electrode layer and an insulating layer on a substrate,
wherein the step of forming the insulating layer is effected with a temperature T of the substrate being controlled to satisfy the following relationship:

$$T \leq Tg \times (\Delta E2/\Delta E1)$$

where Tg is a glass transition temperature of the organic material, $\Delta E1$ is an activation energy for crystallization of the organic material measured while the electrode layer and the insulating layer are not stacked on the functional layer and $\Delta E2$ is an activation energy for crystallization of the organic material while the electrode layer is formed on the functional layer.

2. The method of producing a functional device as defined in claim 1, wherein the step of stacking the insulating layer is effected with the temperature T of the substrate being controlled to 200° C. or less.

3. The method of producing a functional device as defined in claim 1, wherein the electrode layer comprises a light-transmitting material.

4. The method of producing a functional device as defined in claim 3, wherein the electrode layer comprises at least one of ITO, IZO, $SnO_2$, ATO, ZnO and FTO.

5. The method of producing a functional device as defined in claim 1, wherein the insulating layer comprises silicon oxide or silicon nitride.

6. The method of producing a functional device as defined in claim 1, wherein the insulating layer is formed by plasma CVD.

7. The method of producing a functional device as defined in claim 1, wherein the insulating layer is formed by sputtering.

8. The method of producing a functional device as defined in claim 1, wherein the functional device is a photoelectric conversion layer stacked type solid-state image pickup device, the method comprising:
stacking a photoelectric conversion layer containing an organic material on a substrate having a signal reading circuit formed thereon; and
stacking an electrode layer and an insulating layer on the photoelectric conversion layer.

9. The method of producing a functional device as defined in claim 1, wherein the functional device is an organic light-emitting element.

10. A functional device produced by a method of producing a functional device defined in claim 1.

* * * * *